United States Patent
Lin et al.

(10) Patent No.: US 12,364,020 B2
(45) Date of Patent: Jul. 15, 2025

(54) DIODE WITH REDUCED CURRENT LEAKAGE

(71) Applicant: Taiwan Semiconductor Manufacturing Company, Ltd., Hsinchu (TW)

(72) Inventors: Hsin Fu Lin, Hsinchu County (TW); Shiang-Hung Huang, New Taipei (TW); Tsung-Hao Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 587 days.

(21) Appl. No.: 17/667,858

(22) Filed: Feb. 9, 2022

(65) Prior Publication Data

US 2022/0415879 A1   Dec. 29, 2022

Related U.S. Application Data

(60) Provisional application No. 63/216,163, filed on Jun. 29, 2021.

(51) Int. Cl.
| | |
|---|---|
| *H10D 89/60* | (2025.01) |
| *H10D 8/00* | (2025.01) |
| *H10D 8/01* | (2025.01) |
| *H10D 62/10* | (2025.01) |

(52) U.S. Cl.
CPC .......... *H10D 89/611* (2025.01); *H10D 8/043* (2025.01); *H10D 8/411* (2025.01); *H10D 62/126* (2025.01)

(58) Field of Classification Search
CPC ............ H01L 21/0415; H01L 21/2253; H01L 21/265–266; H01L 27/0255; H01L 29/0692; H01L 29/402; H01L 29/66128; H01L 29/8611; H01L 2924/12036; H01L 29/66136; H01L 29/046–047; H01L 21/046; H01L 21/047; H01L 21/3115–31155; H01L 21/32155;
(Continued)

(56) References Cited

U.S. PATENT DOCUMENTS

| | | | |
|---|---|---|---|
| 2006/0043476 A1* | 3/2006 | Kao ..................... | H10D 84/215 257/E27.049 |
| 2012/0098041 A1* | 4/2012 | Verma .................. | H10D 62/393 257/E21.409 |

(Continued)

*Primary Examiner* — Shahed Ahmed
*Assistant Examiner* — Adam D Weiland
(74) *Attorney, Agent, or Firm* — Eschweiler & Potashnik, LLC

(57) ABSTRACT

Various embodiments of the present disclosure are directed towards an integrated chip. The integrated chip includes a well region disposed within a semiconductor substrate and comprises a first doping type. A gate electrode overlies the well region. A first contact region is disposed within the well region and comprises a second doping type opposite the first doping type. A second contact region is disposed within the semiconductor substrate and laterally offset from the well region. The second contact region comprises the first doping type and the gate electrode is disposed between the first contact region and the second contact region. A gate dielectric layer is disposed between the semiconductor substrate and the gate electrode, where a thickness of the gate dielectric layer is greater than about 140 Angstroms.

20 Claims, 11 Drawing Sheets

(58) Field of Classification Search
CPC ..... H01L 21/425–426; H01L 21/76825; H01L 21/76859; H01L 21/76862
See application file for complete search history.

(56) References Cited

U.S. PATENT DOCUMENTS

| | | | |
|---|---|---|---|
| 2014/0001477 A1* | 1/2014 | Chen | H01L 21/761 |
| | | | 257/E27.06 |
| 2017/0162690 A1* | 6/2017 | Edwards | H10D 62/127 |
| 2020/0091295 A1* | 3/2020 | Ohashi | H10D 62/393 |
| 2021/0305242 A1* | 9/2021 | Huang | H10D 8/60 |
| 2022/0384636 A1* | 12/2022 | Edwards | H01L 21/2253 |

* cited by examiner

DIODE WITH REDUCED CURRENT LEAKAGE

REFERENCE TO RELATED APPLICATION

This application claims the benefit of U.S. Provisional Application No. 63/216,163, filed on Jun. 29, 2021, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of semiconductor devices such as transistors, capacitors, diodes, etc. A diode may be formed within the semiconductor substrate and can include two heavily doped regions disposed on opposing sides of a gate structure. Diodes may be used in many applications such as an electrostatic discharge circuit, a clamping circuit, a level shifter, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
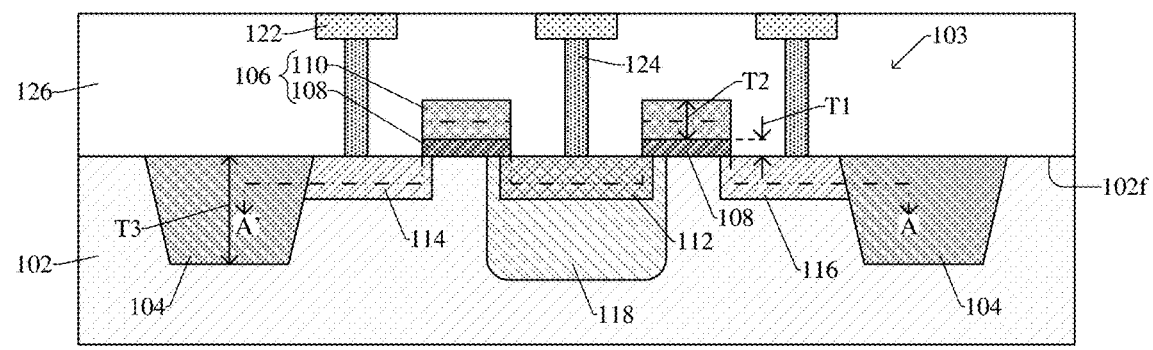
FIGS. 1A and 1B illustrate various views of some embodiments of an integrated chip having a PN diode structure that comprises a gate electrode over a gate dielectric layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A PN diode structure may include a gate structure overlying a well region disposed within a substrate. The gate structure comprises a gate electrode disposed over a gate dielectric layer. A first contact region is disposed within the well region and a second contact region is disposed in the substrate and laterally offset from the well region. The gate structure is disposed laterally between the first contact region and the second contact region. The substrate, well region and second contact region respectively comprise a first doping type (e.g., p-type) and the first contact region comprises a second doping type (e.g., n-type) opposite the first doping type. Thus, the PN diode structure comprises PN junctions along interfaces between the first contact region and the well region. The PN diode structure may be a gate-aligned diode structure such that during fabrication the contact regions are implanted (e.g., by an ion implantation process) in the substrate while the gate structure is disposed along the substrate. A subsequent annealing process may cause portions of the first and second contact regions to diffuse out and directly underlie the gate structure.

Typically, the gate dielectric layer is relatively thin (e.g., having a thickness within a range of 70 to 140 Angstroms) and may result in leakage current. One source of leakage current is gate induced drain leakage (GIDL) current that can be caused when a deep-depletion region forms in one or more areas of the substrate where the gate electrode directly overlies a contact region. For example, the first contact region may be connected to a first voltage (e.g., a positive supply voltage), and the gate electrode and the second contact region may respectively be connected to a second voltage (e.g., ground, a negative supply voltage, or an input/output terminal). Due to a voltage difference between the first contact region and the gate electrode, an electric field is generated and causes formation of a deep-depletion region in the substrate at the one or more areas of the substrate where the gate electrode directly overlies the first contact region. The deep-depletion region can result in band-to-band tunneling between the first contact region and the substrate, thereby resulting in increased leakage current across the PN diode structure when in an off state. This, in part, increases a power consumption of the PN diode structure and decreases an operating range of the PN diode structure, thereby degrading an overall performance of the device.

Various embodiments of the present disclosure are directed towards an integrated chip including a PN diode structure with decreased leakage current. The PN diode structure includes a well region disposed within a substrate and a gate structure over the well region. The gate structure comprises a gate electrode over a gate dielectric layer. Further, the gate structure is ring-shaped and laterally wraps around a first contact region (e.g., configured as cathode) disposed within the well region. A second contact region (e.g., configured as an anode) is disposed on a first side of the gate structure and a third contact region (e.g., configured as an anode) is disposed on a second side of the gate structure opposite the first side, such that the first contact region is disposed laterally between the second and third contact regions. The gate electrode directly overlies an outer region of the first contact region, such that the gate electrode is vertically offset from the outer region of the first contact region by a thickness of the gate dielectric layer. The thickness of the gate dielectric layer is relatively large (e.g., greater than about 140 Angstroms), thereby increasing a distance between the gate electrode and the first contact region. This, in part, reduces the strength of an electric field strength on the substrate due to a voltage difference between the first contact region and the gate electrode. Thus, by virtue of the relatively thick gate dielectric layer increasing the distance between the gate electrode and the contact region, leakage current (e.g., GIDL current) in the PN diode structure may be reduced thereby decreasing power consumption and increasing an operating range of the PN diode structure. Accordingly, an overall performance of the integrated chip is improved.

In addition, during fabrication of the PN diode structure, the gate structure is formed with inner opposing sidewalls defining an opening that exposes an area of a front-side surface of the substrate. Subsequently, the well region is formed by an ion implantation process with the gate structure in place such that the gate structure acts as a masking layer during the ion implantation process. Thus, the ring-shaped layout of the gate structure facilitates precise control of an area of the well region, thereby enhancing performance of the PN diode structure. In addition, forming the well region after forming the gate structure reduces a number of thermal process(es) the well region is exposed to, thereby mitigating diffusion of dopants from the well region. This increases control of the doping profile of the well region and further enhances performance of the PN diode structure.

Figure 1B:
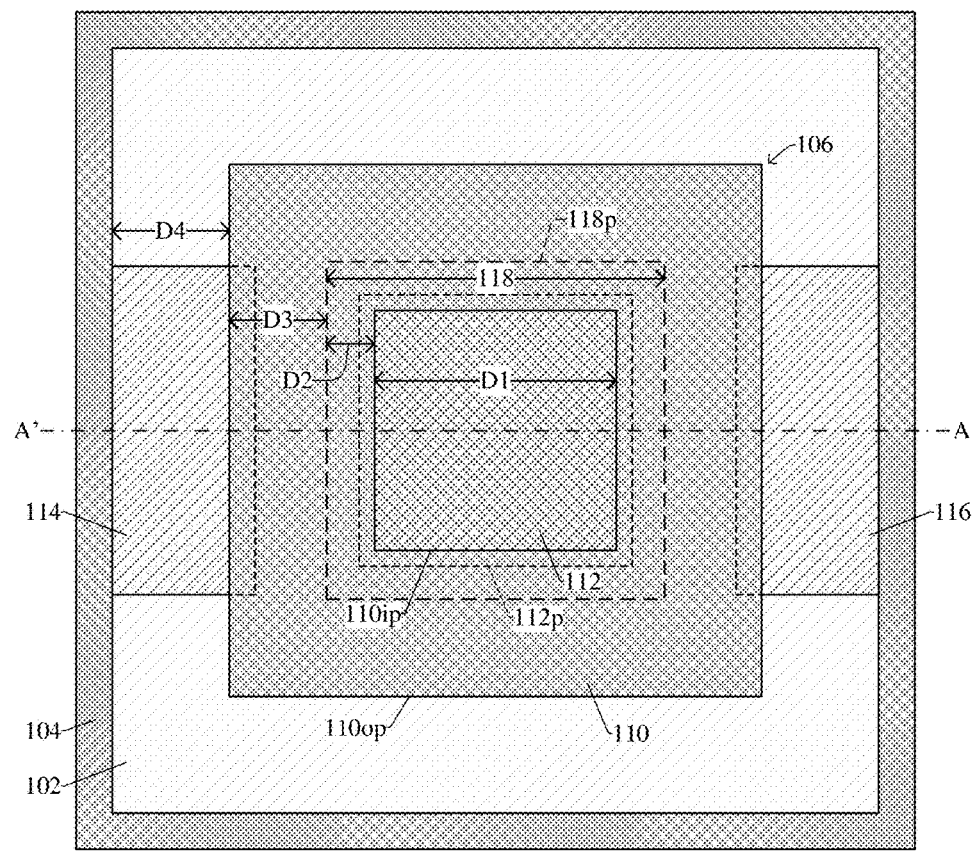

FIGS. 1A and 1B illustrate various views of some embodiments of an integrated chip 100 including a PN diode structure 103 that comprises a gate electrode 110 over a gate dielectric layer 108. FIG. 1A illustrates some embodiments of a cross-sectional view of the integrated chip 100 taken along the line A-A' of a top view of FIG. 1B. FIG. 1B illustrates some embodiments of the top view of the integrated chip 100 taken along the line A-A' of the cross-sectional view of FIG. 1A.

The integrated chip 100 includes the PN diode structure 103 disposed along a front-side surface 102f of a semiconductor substrate 102. In some embodiments, the semiconductor substrate 102 may, for example, be or comprise bulk silicon, a silicon-on-insulator (SOI) substrate, or another suitable semiconductor material and has a first doping type (e.g., p-type). An isolation structure 104 extends from a front-side surface 102f of the semiconductor substrate 102 to a point below the front-side surface 102f. The isolation structure 104 may be configured as a shallow trench isolation (STI) structure and may demarcate a device region of the semiconductor substrate 102. The PN diode structure 103 comprises a gate structure 106, a well region 118, and a plurality of contact regions 112-116. The gate structure 106 overlies the front-side surface 102f of the semiconductor substrate 102. Further, the gate structure 106 comprises the gate dielectric layer 108 disposed along the front-side surface 102f of the semiconductor substrate 102 and the gate electrode 110 disposed over the gate dielectric layer 108.

The plurality of contact regions 112-116 are disposed within the semiconductor substrate 102 between inner sidewalls of the isolation structure 104. In various embodiments, the plurality of contact regions 112-116 comprise a first contact region 112, a second contact region 114, and a third contact region 116. The first contact region 112 is disposed within the well region 118, and the second and third contact regions 114, 116 are disposed on opposing sides of the gate structure 106. In various embodiments, the well region 118, the second contact region 114, and the third contact region 116 have the first doping type (e.g., p-type), and the first contact region 112 has a second doping type (e.g., n-type) opposite the first doping type. In some embodiments, the first doping type is p-type and the second doping type is n-type, or vice versa. The first, second, and third contact regions 112, 114, 116 respectively have a higher doping concentration than the well region 118. Thus, the PN diode structure 103 may be configured as an N+/P-well diode such that it comprises PN junctions along interfaces between the first contact region 112 and the well region 118. The first contact region 112 may be configured as a cathode of the PN diode structure 103 and the second and/or third contact regions 114, 116 may be configured as an anode of the PN diode structure 103. During operation of the PN diode structure 103, current may flow from the second and/or third contact regions 114, 116 to the first contact region when a positive voltage is applied between the anode and the cathode. In various embodiments, the PN diode structure 103 may be configured as a clamping diode (e.g., in an electrostatic discharge (ESD) circuit) where the first contact region 112 is electrically coupled to a first voltage rail (e.g., a positive voltage rail) and the second and/or third contact regions are electrically coupled to an input/output (I/O) terminal.

The gate structure 106 laterally wraps around the first contact region 112. In various embodiments, the gate electrode 110 and the gate dielectric layer 108 are respectively ring-shaped and continuously laterally extend around the first contact region 112 along a closed path (as illustrated in the top view of FIG. 1B). In further embodiments, the gate electrode 110 is electrically coupled to the second contact region 114 and the third contact region 116. In various embodiments, the ring-shaped layout of the gate electrode 110 may facilitate having precise control of an area of the well region 118 and/or the first contact region 112, thereby ensuring that an area of the PN junctions along the interfaces between the first contact region 112 and the well region 118 may be precisely defined. In some embodiments, the gate electrode 110 directly overlies at least an outer region of the first contact region 112. An interconnect structure overlies the front-side surface 102f of the semiconductor substrate 102 and comprises a plurality of conductive wires 122 and a plurality of conductive vias 124 disposed within a dielectric structure 126.

The gate dielectric layer 108 has a first thickness T1 that is relatively large (e.g., greater than about 140 Angstroms) and facilitates the gate electrode 110 being spaced from the outer region of the first contact region 112 by a non-zero distance that is equal to the first thickness T1. By virtue of the layout of the gate structure 106 relative to the doped regions of the PN diode structure 103 (e.g., the plurality of contact regions 112-116 and the well region 118) and the first thickness T1 being relatively large, the negative effects (e.g., formation of the deep-depletion region in and/or around the outer region of the first contact region 112 where the gate electrode 110 directly overlies the first contact region 112) in relation to GIDL current is reduced. This, in part, decreases a power consumption of the PN diode structure 103 and increases an operating range of the PN diode structure 103, thereby improving an overall performance of the integrated chip 100.

In various embodiments, the gate dielectric layer 108 may, for example, be or comprise silicon dioxide, hafnium oxide, another suitable high κ dielectric material, some other suitable dielectric material, or any combination of the foregoing. As used herein, a high κ dielectric material is a dielectric material with a dielectric constant greater than 3.9. The gate electrode 110 may, for example, be or comprise polysilicon, intrinsic polysilicon, doped polysilicon, a metal material, some other suitable conductive material, or any combination of the foregoing. The isolation structure 104 may, for example, be or comprise silicon dioxide, silicon nitride, silicon carbide, silicon oxynitride, another suitable dielectric material, or any combination of the foregoing.

The gate electrode 110 has a second thickness T2 and the isolation structure 104 has a third thickness T3. In some embodiments, the first thickness T1 of the gate dielectric layer 108 is less than the second thickness T2 of the gate electrode 110, and the second thickness T2 of the gate electrode 110 is less than the third thickness T3 of the isolation structure 104. In various embodiments, the first thickness T1 of the gate dielectric layer 108 is greater than 140 Angstroms, within a range of about 140 to 400 Angstroms, or another suitable value. In some embodiments, by virtue of the first thickness T1 of the gate dielectric layer 108 being relatively large (e.g., greater than about 140 Angstroms), GIDL is reduced while maintaining a breakdown voltage of the PN diode structure 103. In some embodiments, if the first thickness T1 of the gate dielectric layer 108 is relatively thin (e.g., less than about 140 Angstroms), then a distance between the gate electrode 110 and the first contact region 112 is decreased thereby increasing current leakage (e.g., GIDL current) in the PN diode structure 103. In yet further embodiments, if the first thickness T1 of the gate dielectric layer 108 is greater than about 400 Angstroms, then fabrication costs may be increased and/or the semiconductor substrate 102 may be damaged by a high energy ion implantation process that forms at least a portion of the well region 118 in the semiconductor substrate 102 through the gate dielectric layer 108.

In further embodiments, the second thickness T2 of the gate electrode 110 is greater than 800 Angstroms, within a range of about 800 to 2,000 Angstroms, or another suitable value. In some embodiments, if the second thickness T2 of the gate electrode 110 is relatively thin (e.g., less than about 800 Angstroms), then the gate electrode 110 may not function properly as a hard mask layer during fabrication of the well region 118 thereby mitigating an ability to precisely control the area of the well region 118. This, in part, mitigates an ability to precisely control an area of the PN junctions along interfaces between the well region 118 and the first contact region 112, thereby adversely affecting a performance of the PN diode structure 103. In yet further embodiments, if the second thickness T2 of the gate electrode 110 is greater than about 2,000 Angstroms, then fabrication costs may be increased and/or formation of at least an outer portion of the well region 118 through the gate electrode 110 may be adversely affected. This, in part, may decrease precise control of the area of the well region 118.

In various embodiments, the third thickness T3 of the isolation structure 104 is greater than about 1,200 Angstroms, within a range of about 1,200 to 4,000 Angstroms, or another suitable value. In further embodiments, if the third thickness T3 of the isolation structure 104 is relatively thin (e.g., less than about 1,200 Angstroms), then isolation of the PN diode structure 103 from other semiconductor devices (not shown) disposed on/over the semiconductor substrate 102 is decreased. In yet further embodiments, if the third thickness T3 of the isolation structure 104 is relatively thick (e.g., greater than about 4,000 Angstroms), then a cost and time to fabricate the PN diode structure 103 may be increased. In some embodiments, a first ratio between the first thickness T1 and the second thickness T2 (e.g., T1:T2) is within a range of about 1:2 to about 1:14, about 1:6, about 1:14, about 1:2, about 1:5, or another suitable value. Thus, the second thickness T2 is at least 2 times greater than the first thickness T1. In further embodiments, a second ratio between the first thickness T1 and the third thickness T3 (e.g., T1:T3) is within a range of about 1:3 to about 1:28, about 1:8, about 1:9, about 1:28, about 1:3, about 1:10, or another suitable value.

The second and third contact regions 114, 116 have the first doping type (e.g., p+ doping) with a doping concentration that is, for example, greater than about $10^{19}$ atoms per cubic centimeter (atoms/cm$^3$), within a range of about $10^{19}$ to $10^{20}$ atoms/cm$^3$, or anther suitable value. The well region 118 has the first doping type (e.g., p doping) with a doping concentration that is, for example, greater than about $10^{16}$ atoms/cm$^3$, within a range of about $10^{16}$ to $10^{18}$ atoms/cm$^3$, or another suitable value. The first contact region 112 has the second doping type (e.g., n+ doping) with a doping concentration that is, for example, greater than about $10^{19}$ atoms/cm$^3$, within a range of about $10^{19}$ to $10^{20}$ atoms/cm$^3$, or anther suitable value. Thus, in some embodiments, the second and third contact regions 114, 116 may respectively have a doping concentration that is equal to that of the first contact region 112. In yet further embodiments, the first contact region 112 has a doping concentration that is greater than that of the well region 118. For example, the well region 118 may have a doping concentration that is within a range of about $10^{16}$ to $10^{18}$ atoms/cm$^3$, while the first contact region 112 may have a doping concentration that is within a range of about $10^{19}$ to $10^{20}$ atoms/cm$^3$.

With reference to the top view of the integrated chip 100 in FIG. 1B, the gate structure 106 is ring-shaped and directly overlies an outer region of the first contact region 112. Thus, in some embodiments, the gate electrode 110 directly overlies an outer perimeter 112p of the first contact region 112 where the PN diode structure 103 comprises PN junctions along the interfaces between the outer perimeter 112p of the first contact region 112 and the well region 118. In addition, the gate electrode 110 overlies at least a portion of the second contact region 114 and the third contact region 116, respectively.

In various embodiments, a first distance D1 between inner opposing sidewalls of the gate electrode 110 is within a range of about 1 to 300 micrometers, within a range of about 200 to 500 micrometers, less than about 200 micrometers, or another suitable value. A second distance D2 between an inner perimeter 110ip of the gate electrode 110 and an outer perimeter 118p of the well region 118 is within a range of about 0.5 to 3 micrometers, greater than about 0.5 micrometers, within a range of about 1.75 to 3 micrometers, or another suitable value. A third distance D3 between the outer perimeter 118p of the well region 118 and an outer perimeter 110op of the gate electrode 110 is within a range of about 0.5 to 3 micrometers, within a range of about 2 to 3 micrometers, or another suitable value. In various embodiments, the third distance D3 is greater than the second distance D2. A fourth distance D4 between the outer perimeter 110op of the gate electrode 110 and a sidewall(s) of the isolation structure 104 is within a range of about 0.5 to 3 micrometers, within a range of about 1 to 3 micrometers, or another suitable value.

Figure 2A:
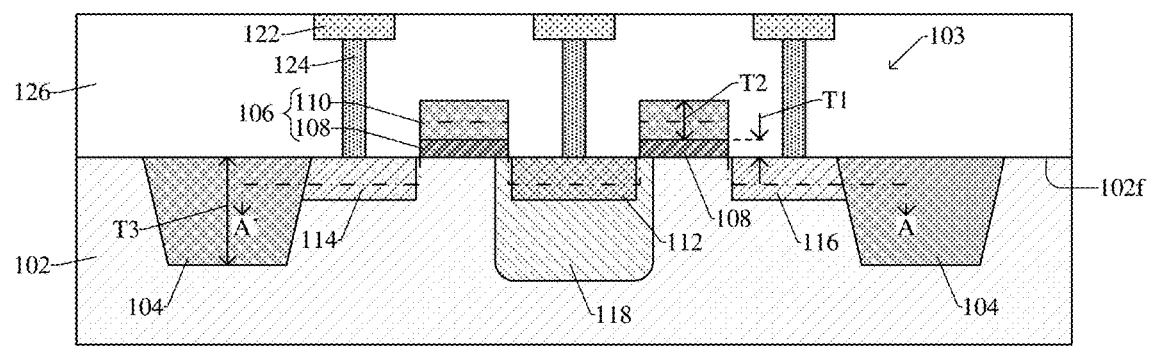
FIGS. 2A, 2B, and 3 illustrate various views of other embodiments of an integrated chip having a PN diode structure that comprises a gate electrode over a gate dielectric layer.
Figure 2B:
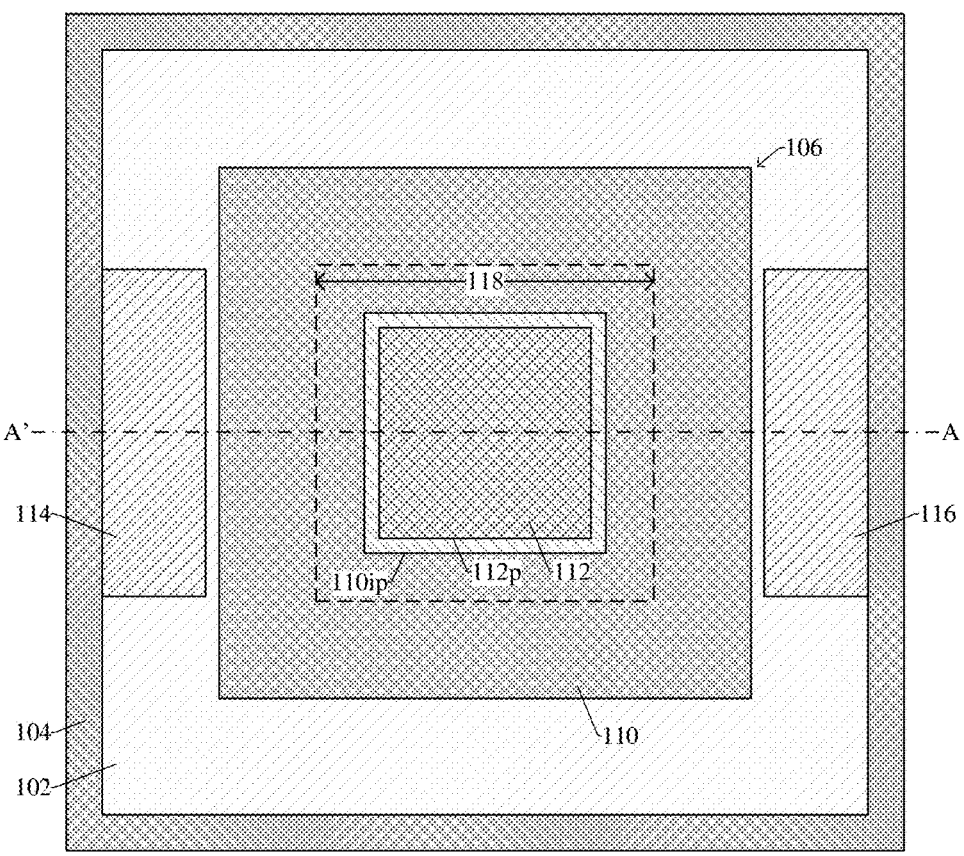

FIGS. 2A and 2B illustrate various views of some embodiments of an integrated chip 200 in accordance with some alternative embodiments of the integrated chip 100 of FIGS. 1A and 1B. FIG. 2A illustrates some embodiments of a cross-sectional view of the integrated chip 200 taken along the line A-A' of a top view of FIG. 2B. FIG. 2B illustrates some embodiments of the top view of the integrated chip 200 taken along the line A-A' of the cross-sectional view of FIG. 2A.

As illustrated in FIGS. 2A and 2B, the outer perimeter 112p of the first contact region 112 is laterally offset from the inner perimeter 110ip of the gate electrode 110 by a non-zero distance in a direction towards a center of the first contact region 112. Thus, in some embodiments, the well region 118 is disposed laterally between the inner perimeter 110ip of the gate electrode 110 and the outer perimeter 112p of the first contact region 112. By spacing the outer perimeter 112p of the first contact region 112 from the inner perimeter 110ip of the gate electrode 110 by the non-zero distance in the direction towards the center of the first contact region 112, the distance between the gate electrode 110 and the first contact region 112 is further increased. This further reduces the negative effects in relation to GIDL current, thereby further increasing the performance of the PN diode structure 103. Further, the second contact region 114 is laterally offset from a first outer sidewall of the gate electrode 110 by a non-zero distance in a first direction away from the gate electrode 110. The third contact region 116 is laterally offset from a second outer sidewall of the gate electrode by a non-zero distance in a second direction away from the gate electrode 110.

Figure 3:
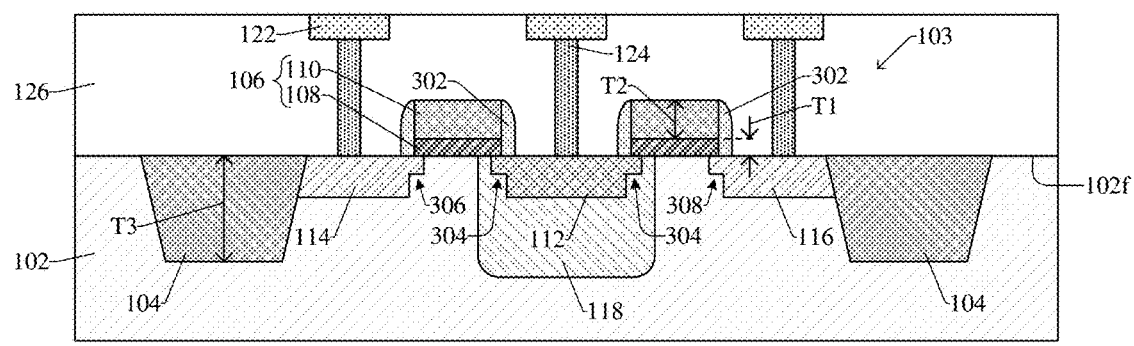

FIG. 3 illustrates a cross-sectional view of some embodiments of an integrated chip 300 in accordance with some alternative embodiments of the integrated chip 100 of FIGS. 1A and 1B, in which a sidewall spacer structure 302 is disposed on opposing sidewalls of the gate structure 106.

The sidewall spacer structure 302 continuously extends from opposing sidewalls of the gate dielectric layer 108 to opposing sidewalls of the gate electrode 110. The sidewall spacer structure 302 may, for example, be or comprise silicon nitride, silicon carbide, silicon oxynitride, silicon oxycarbide, another suitable dielectric material, or any combination of the foregoing. Further, the PN diode structure 103 comprises a plurality of contact extension regions 304-308. A first contact extension region 304 abuts the first contact region 112 and continuously laterally extends from under the sidewall spacer structure 302 to a point under the gate electrode 110. In various embodiments, the first contact extension region 304 is ring-shaped when viewed from above. A second contact extension region 306 abuts the second contact region 114 and a third contact extension region 308 abuts the third contact region 116. In various embodiments, the second and third contact extension regions 306, 308 comprise the first doping type (e.g., p-type) and may each have a doping concentration less than that of the second and third contact regions 114, 116. Further, the first contact extension region 304 comprises the second doping type (e.g., n-type) and may have a doping concentration that is less than that of the first contact region 112. In some embodiments, the first, second, and third contact extension regions 304, 306, 308 are respectively configured as a lightly-doped contact extension region and may be formed using an angled ion implantation process. In further embodiments, the plurality of contact extension regions 304-308 are formed after forming the well region 118 and before forming the plurality of contact regions 112-116.

Figure 4:
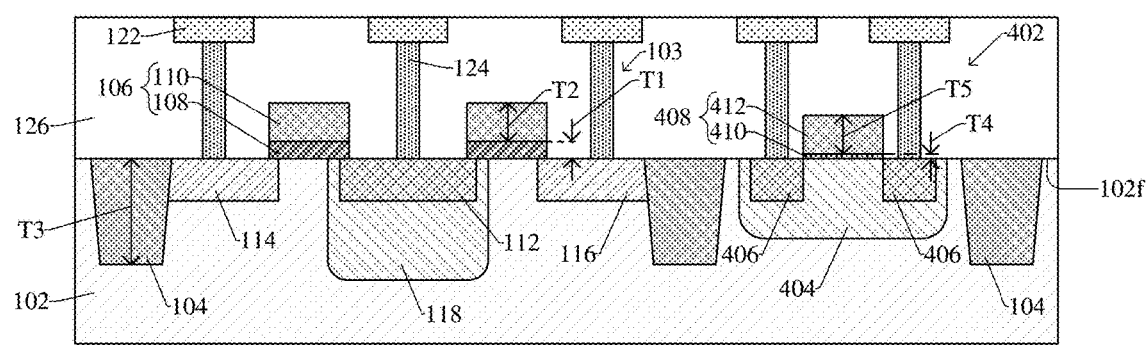
FIG. 4 illustrates a cross-sectional view of some embodiments of an integrated chip having a PN diode structure laterally adjacent to a transistor, where the PN diode structure comprises a gate electrode over a gate dielectric layer.

FIG. 4 illustrates a cross-sectional view of some embodiments of an integrated chip 400 comprising the PN diode structure 103 and a transistor 402 disposed on the front-side surface 102f of the semiconductor substrate 102.

In some embodiments, the isolation structure 104 is disposed within the semiconductor substrate 102 and laterally encloses the PN diode structure 103 and the transistor 402. The transistor 402 has a second gate structure 408 overlying the semiconductor substrate 102 and a pair of source/drain regions 406 disposed within a second well region 404. The second gate structure 408 comprises a second gate electrode 412 overlying a second gate dielectric layer 410. The pair of source/drain regions 406 are disposed on opposing sides of the second gate electrode 412. In various embodiments, the source/drain regions 406 has edges aligned to opposite sides of the second gate structure 408. The second well region 404 comprises the first doping type (e.g., p-type) and the source/drain regions 406 comprise the second doping type (e.g., n-type). The transistor 402 is laterally separated from the PN diode structure 103 by a segment of the isolation structure 104. The gate dielectric layer 108 has the first thickness T1, the gate electrode 110 has the second thickness T2, and the isolation structure 104 has the third thickness T3 as illustrated and/or described in FIGS. 1A and 1B above. Further, the second gate dielectric layer 410 has a fourth thickness T4 and the second gate electrode 412 has a fifth thickness T5 that is greater than the fourth thickness T4. In some embodiments, the fifth thickness T5 is approximately equal to the second thickness T2 of the gate electrode 110 and may be within a range of about 800 Angstroms to 2,000 Angstroms, or another suitable value. In yet further embodiments, the fourth thickness T4 is less than the first thickness T1 of the gate dielectric layer 108 and may, for example, be less than 140 Angstroms.

Figure 5:
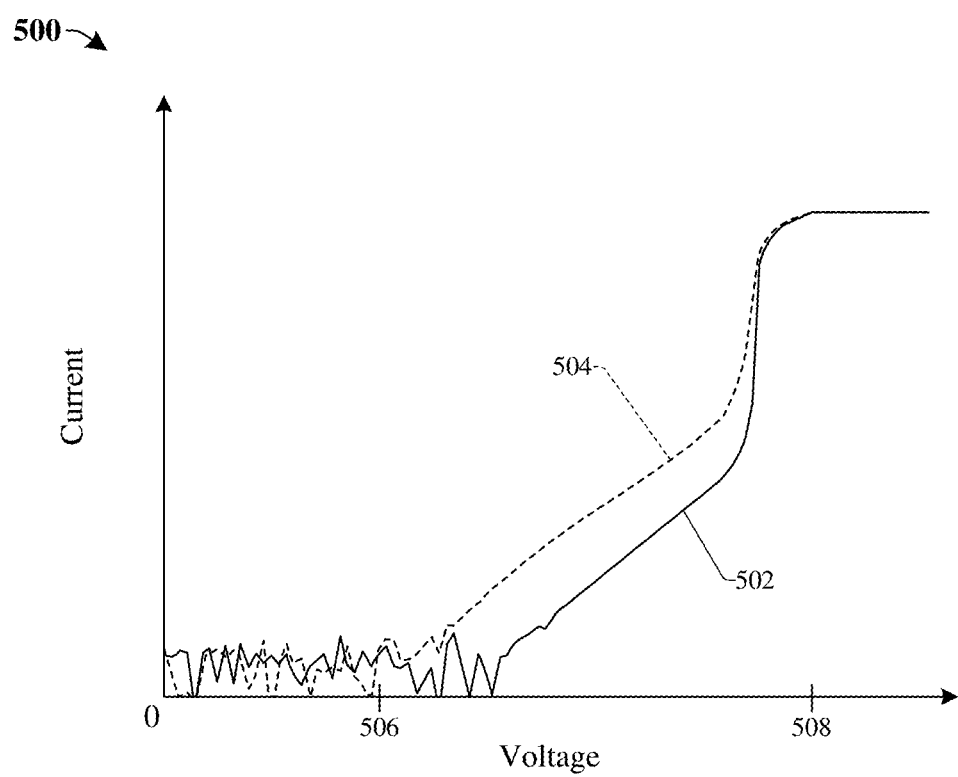
FIG. 5 illustrates some embodiments of a graph which sets forth Current-Voltage (IV) characteristics and performance examples for various embodiments of a PN diode structure comprising a gate electrode over a gate dielectric layer.

FIG. 5 illustrates some embodiments a graph having IV curves of various embodiments of a PN diode structure comprising a gate electrode over a gate dielectric layer. In various embodiments, the IV curves reflect an embodiment in which an anode (e.g. the first contact region 112 of FIGS. 1A and 1B) of the PN diode structure is electrically coupled to a positive voltage rail, and the cathode (e.g., second and/or third contact regions 114, 116 of FIGS. 1A and 1B) and gate electrode (e.g., gate electrode 110 of FIGS. 1A and 1B) are electrically coupled to ground or a negative voltage rail.

In various embodiments, a first IV curve 502 represents the IV characteristics of some embodiments of the PN diode structure (e.g., 103 of FIGS. 1A and 1B) comprising the gate dielectric layer (e.g., 108 of FIG. 1A) with a relatively large thickness (e.g., greater than 140 Angstroms). Further, a second IV curve 504 represents the IV characteristics of some embodiments of a second PN diode structure having a gate dielectric layer with a relatively thin thickness (e.g., less than 140 Angstroms). As can be seen by a comparison of the first IV curve 502 and the second IV curve 504, the second PN diode structure that has the gate dielectric layer with the relatively thin thickness (e.g., less than 140 Angstroms) suffers from degraded performance due to a higher current across a first operating range (e.g., from a first voltage 506 to a second voltage 508). This, in part, is because the second PN diode structure has higher GIDL current as a result of the relatively thin thickness of the gate dielectric layer. Accordingly, as seen in FIG. 5 the current across the second PN diode structure in the first operating range (e.g., from the first voltage 506 to the second voltage 508) is greater than the current across the PN diode structure (e.g., 103 of FIGS. 1A and 1B) having the gate dielectric layer with the relatively large thickness. Thus, by virtue of the gate dielectric layer (e.g., 108 of FIG. 1A) having the relatively large thickness (e.g., greater than 140 Angstroms), a current operating range of the PN diode structure (e.g., 103 of FIGS. 1A and 1B) is increased and power consumption of the PN diode structure (e.g., 103 of FIGS. 1A and 1B) is decreased, thereby increasing an overall performance of the integrated chip.

FIGS. 6A-6B through 11A-11B illustrate various views of some embodiments of a method for forming an integrated chip comprising a PN diode structure having a gate electrode over a gate dielectric layer according to the present disclosure. Figures with a suffix of "A" illustrate a cross-sectional view of the integrated chip during various formation processes. Figures with a suffix of "B" illustrate a top view taken along the line A-A' of Figures with a suffix of "A". Although the various views shown in FIGS. 6A-6B through 11A-11B are described with reference to a method, it will be appreciated that the structures shown in FIGS. 6A-6B through 11A-11B are not limited to the method but rather may stand alone separate of the method. Although FIGS. 6A-6B through 11A-11B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 6A:
FIGS. 6A-6B through 11A-11B illustrate various views of some embodiments of a method for forming an integrated chip having a PN diode structure that comprises a gate electrode over a gate dielectric layer.
Figure 6B:
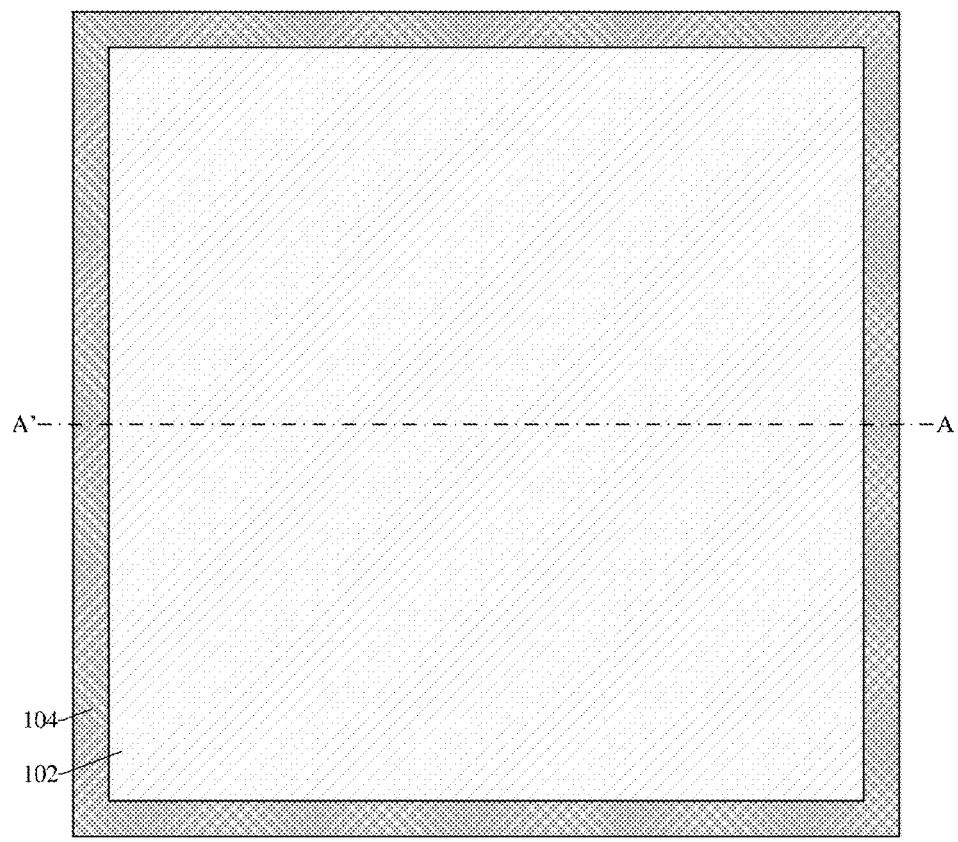

As shown in cross-sectional view 600a and top view 600b of FIGS. 6A-6B, an isolation structure 104 is formed into a front-side surface 102f of a semiconductor substrate 102. In some embodiments, a process for forming the isolation structure 104 may include: forming a masking layer (not shown) over the front-side surface 102f of the semiconductor substrate 102; selectively etching the semiconductor substrate 102 according to the masking layer to form an opening that extends into the front-side surface 102f of the semiconductor substrate 102; filling (e.g., by chemical vapor deposition (CVD), physical vapor deposition (PVD), atomic layer deposition (ALD), thermal oxidation, etc.) the opening with a dielectric material; and performing a removal process to remove the masking layer. In various embodiments, after filling the opening with the dielectric material, a planarization process (e.g., a chemical mechanical planarization (CMP) process) may be performed on the dielectric material. The isolation structure 104 is formed to have a third thickness T3 that is greater than about 1,200 Angstroms, within a range of about 1,200 to 4,000 Angstroms, or another suitable value.

Figure 7A:
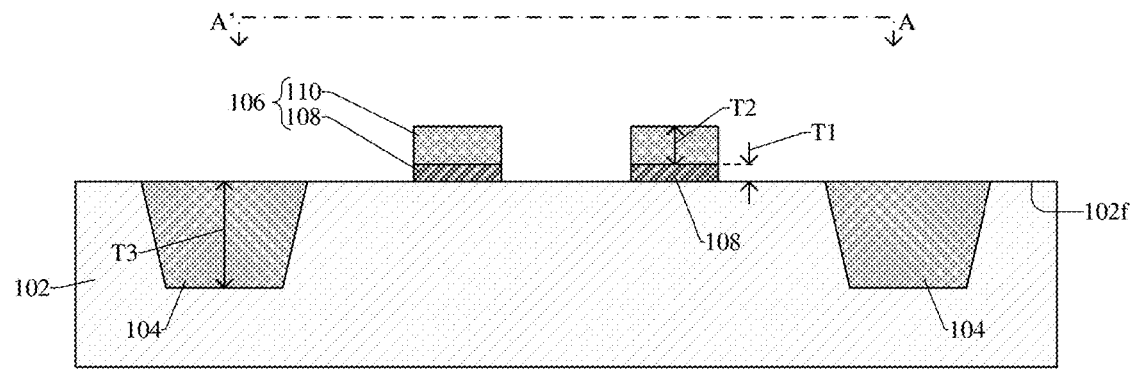
Figure 7B:
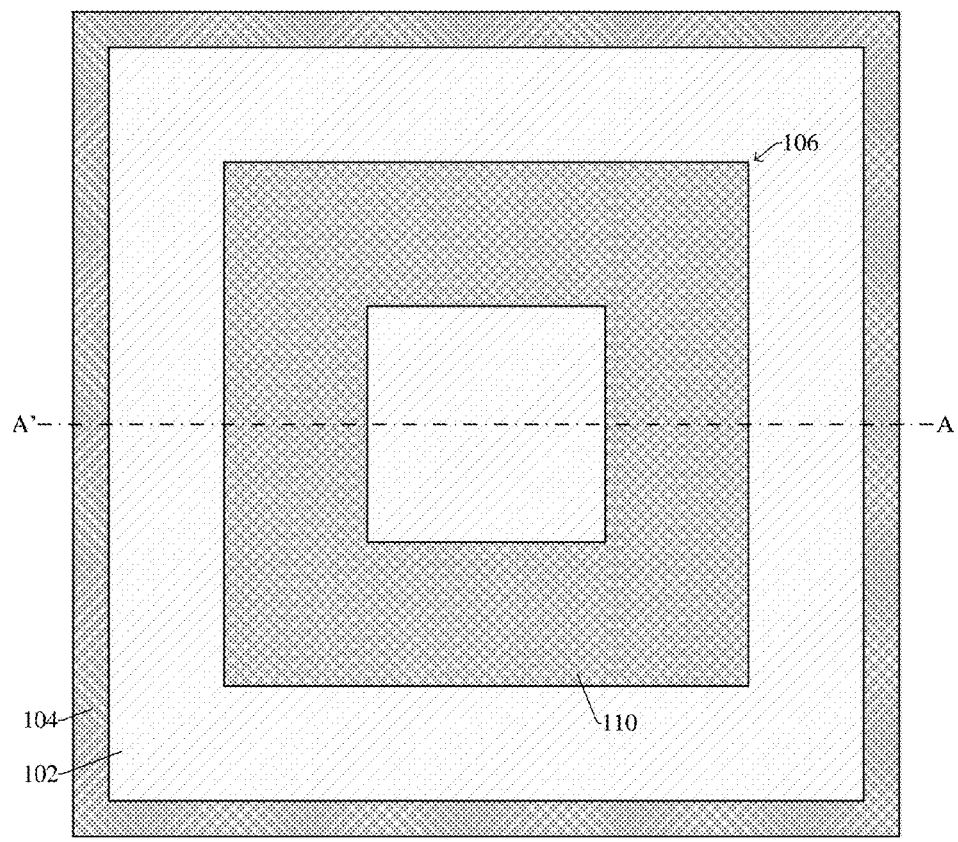

As shown in cross-sectional view 700a and top view 700b of FIGS. 7A-7B, a gate structure 106 is formed over the front-side surface 102f of the semiconductor substrate 102. The gate structure 106 includes a gate electrode 110 overlying a gate dielectric layer 108. In various embodiments, as seen in FIG. 7B the gate structure 106 is formed such that the gate electrode 110 and the gate dielectric layer 108 are respectively ring-shaped when viewed from above. Further, the gate dielectric layer 108 is formed with a first thickness T1 and the gate electrode 110 is formed with a second thickness T2. In some embodiments, a process for forming the gate structure 106 includes: depositing (e.g., by CVD, PVD, ALD, thermal oxidation, etc.) a gate dielectric material having the first thickness T1 over the front-side surface 102f of the semiconductor substrate 102; depositing (e.g., by CVD, PVD, ALD, sputtering, electroplating, etc.) a gate electrode material having the second thickness T2 over the gate dielectric material; and patterning the gate dielectric material and the gate electrode material according to a masking layer (not shown) to form the gate structure 106. In some embodiments, the first thickness T1 of the gate dielectric layer 108 is less than the second thickness T2 of the gate electrode 110, and the second thickness T2 of the gate electrode 110 is less than the third thickness T3 of the isolation structure 104.

The gate dielectric layer 108 may, for example, be or comprise silicon dioxide, hafnium oxide, another suitable high κ dielectric material, some other suitable dielectric material, or any combination of the foregoing. The gate electrode 110 may, for example, be or comprise polysilicon, intrinsic polysilicon, doped polysilicon, a metal material, some other suitable conductive material, or any combination of the foregoing. In yet further embodiments, the first thickness T1 of the gate dielectric layer 108 is greater than about 140 Angstroms, within a range of about 140 to 400 Angstroms, or another suitable value. In various embodiments, the second thickness T2 of the gate electrode 110 is greater than 800 Angstroms, within a range of about 800 to 2,000 Angstroms, or another suitable value.

Figure 8A:
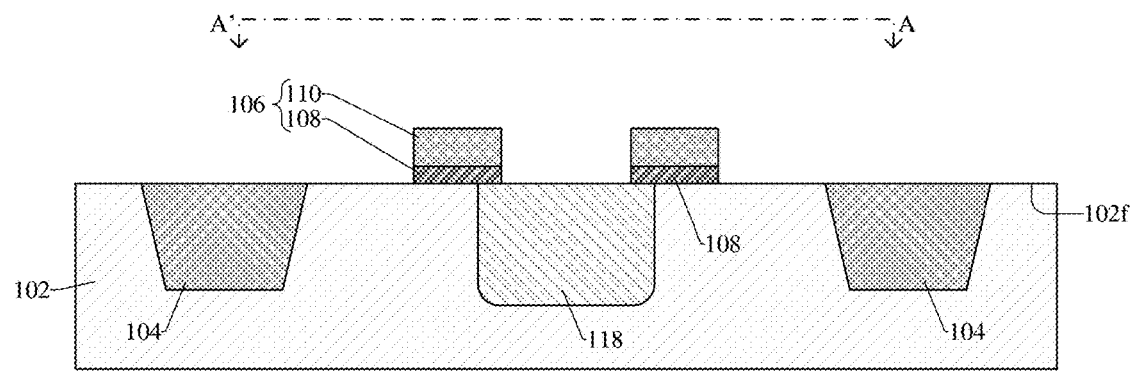
Figure 8B:
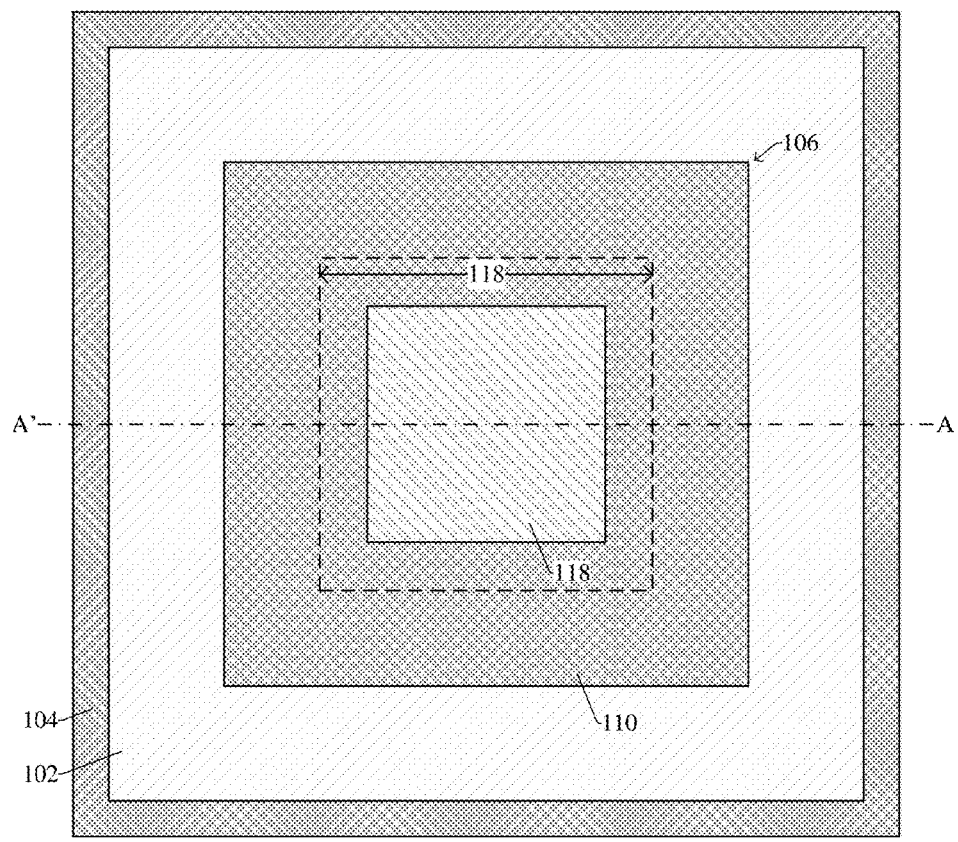

As shown in cross-sectional view 800a of FIG. 8A and top view 800b of FIGS. 8A-8B, a well region 118 is formed within the semiconductor substrate 102 between opposing sidewalls of the gate electrode 110. In some embodiments, a process for forming the well region 118 includes performing an ion implantation process and selectively implanting dopants into the semiconductor substrate 102 according to the gate electrode 110 and/or another masking layer (not shown). In yet further embodiments, before the ion implantation process another masking layer is formed over an outer region of the gate electrode 110 and leaves a region of the semiconductor substrate 102 within an inner perimeter of the gate electrode 110 exposed. In various embodiments, the ring-shaped layout of the gate electrode 110 may facilitate having precise control of an area of the well region 118. Further, the well region 118. In some embodiments, the well region 118 has a first doping type (e.g., p-type) with a doping concentration that is, for example, greater than about $10^{16}$ atoms/cm$^3$, within a range of about $10^{16}$ to $10^{18}$ atoms/cm$^3$, or another suitable value. P-type dopants of the first doping type may, for example, be or comprise boron, difluoroboron (e.g., BF2), indium, some other suitable p-type dopants, or any combination of the foregoing.

In some embodiments, at least a portion of the well region 118 is formed through the gate electrode 110. By forming the well region 118 after the gate structure 106 diffusion of dopants in the well region 118 is reduced, thereby facilitating precise control of the area and a doping profile of the well region 118. For example, because the well region 118 is formed after the gate electrode 110 and the gate dielectric layer 108 are formed, the well region 118 is not exposed to thermal processes used while forming the gate electrode 110 and the gate dielectric layer 108. Having precise control of the area and the doping profile of the well region 118 enhances performance of the PN diode structure.

Figure 9A:
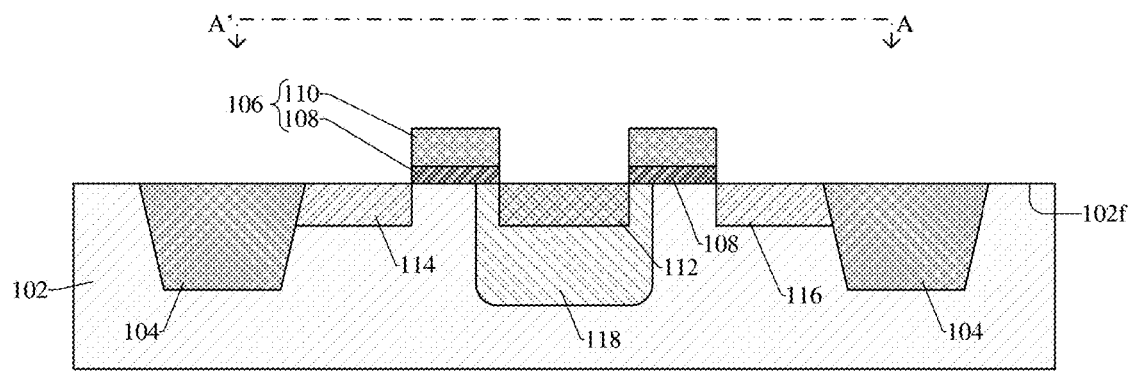
Figure 9B:
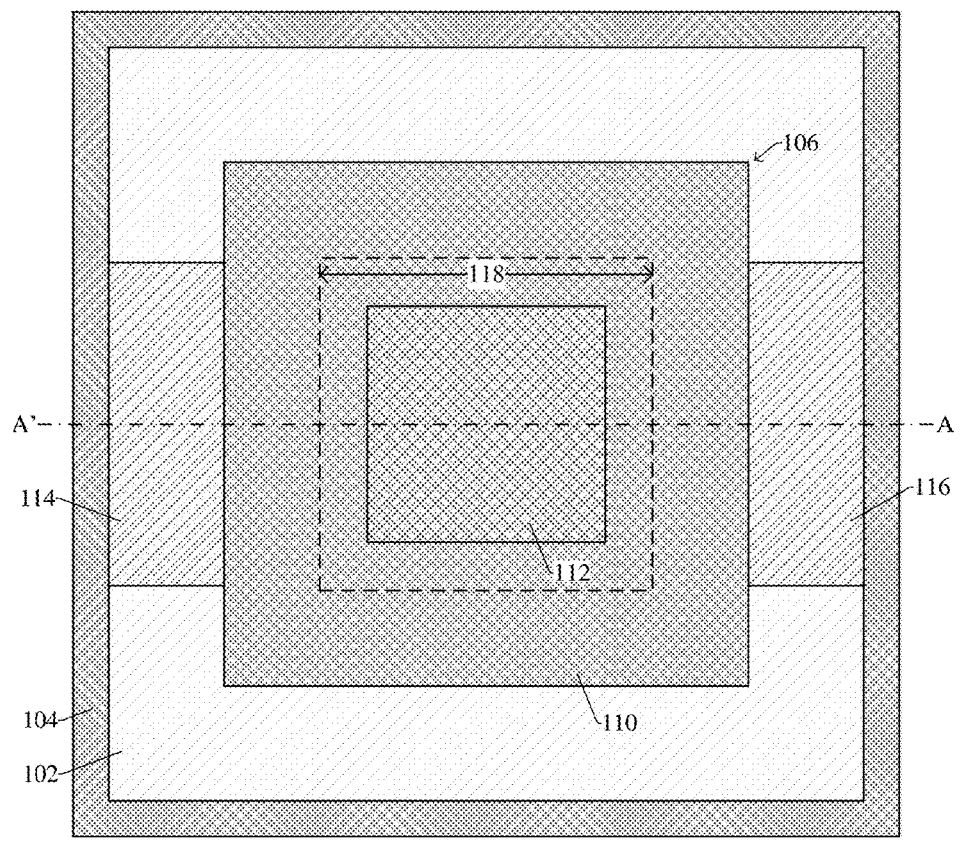

As shown in cross-sectional view 900a of FIG. 9A and top view 900b of FIGS. 9A-9B, one or more ion implantation processes are performed on the semiconductor substrate 102 to form a plurality of contact regions 112-116 within the semiconductor substrate 102. The plurality of contact regions 112-116 comprise a first contact region 112, a second contact region 114, and a third contact region 116. The second and third contact regions 114, 116 comprise the first doping type (e.g., p-type) and the first contact region 112 comprises a second doping type (e.g., n-type) opposite the first doping type. In some embodiments, the one or more ion implantation processes may each include: forming a masking layer (not shown) over the semiconductor substrate 102; selectively implanting dopants according to the masking layer into the semiconductor substrate 102; and performing a removal process to remove the masking layer. Further, the dopants may be selectively implanted into the semiconductor substrate 102 according to the gate structure 106. In various embodiments, the first contact region 112 may be formed by a first ion implantation process and the second and third contact regions 114, 116 may be formed by a separate second ion implantation process. N-type dopants of the second doping type may, for example, be or comprise phosphorous, arsenic, antimony, some other suitable n-type dopants, or any combination of the foregoing. The first, second, and third contact regions 112, 114, 116 respectively have a doping concentration that is greater than about $10^{19}$ atoms/cm$^3$, within a range of about $10^{19}$ to $10^{20}$ atoms/cm$^3$, or anther suitable value. In yet further embodiments, the first, second, and third contact regions 112, 114, 116 may respectively be formed such that edges, sidewalls, and/or a perimeter of the first, second, and third contact regions 112, 114, 116 is/are aligned with corresponding edges and/or sidewalls of the gate electrode 110.

Figure 10A:
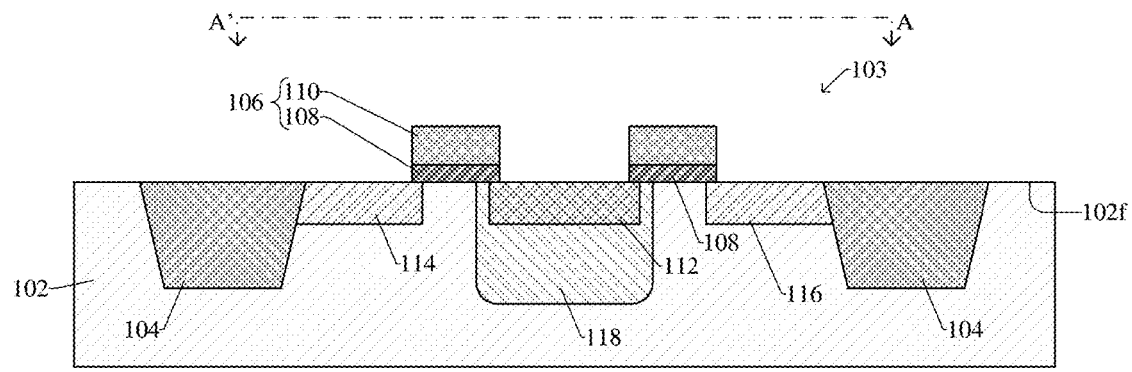
Figure 10B:
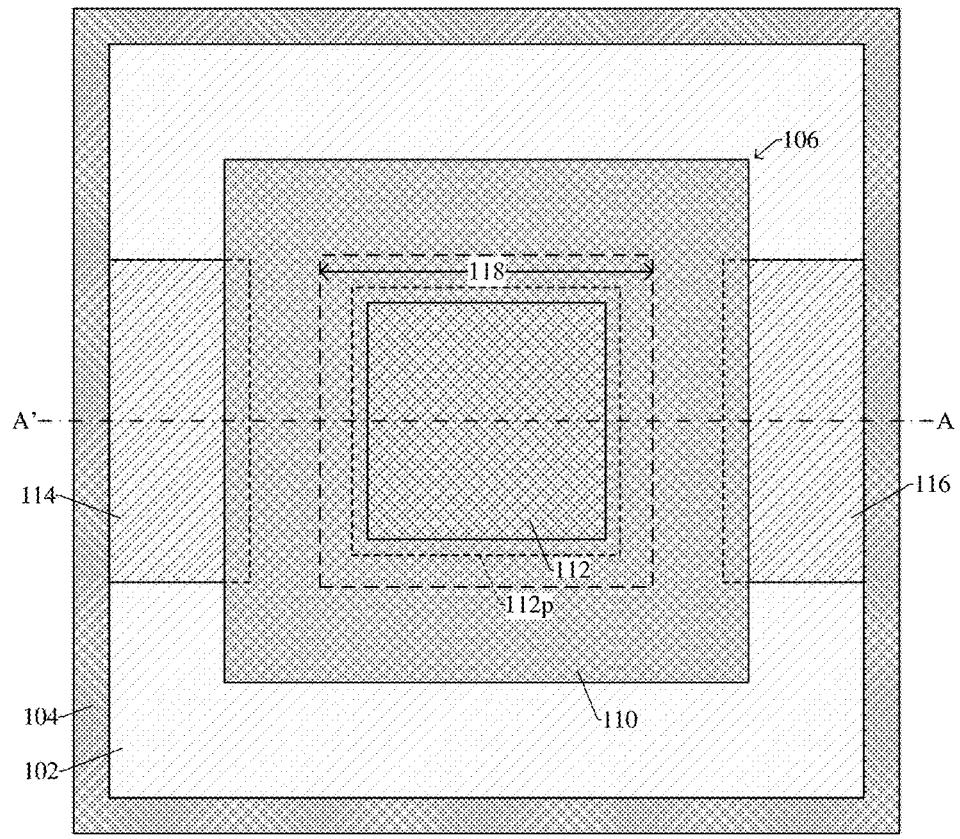

As shown in cross-sectional view 1000a of FIG. 10A and top view 1000b of FIGS. 10A-10B, an annealing process is performed on the semiconductor substrate 102. In various embodiments, the annealing process of FIGS. 10A-10B may be part of the formation process of the first, second, and third contact regions 112, 114, 116. Further, the annealing process may be performed to cure crystalline defects within the semiconductor substrate 102 as a result of any previous ion implantation process(es) and/or activates the dopants implanted into the semiconductor substrate 102. In some embodiments, the annealing process may drive dopants from any of the first, second, and third contact regions 112, 114, 116 into the semiconductor substrate 102, thereby expanding a size the aforementioned doped regions within the semiconductor substrate 102. Thus, in some embodiments, the gate electrode 110 overlies at least a portion of each one of the first, second, and third contact regions 112, 114, 116. For example, the gate electrode 110 directly overlies an outer perimeter 112p of the first contact region 112.

Figure 11A:
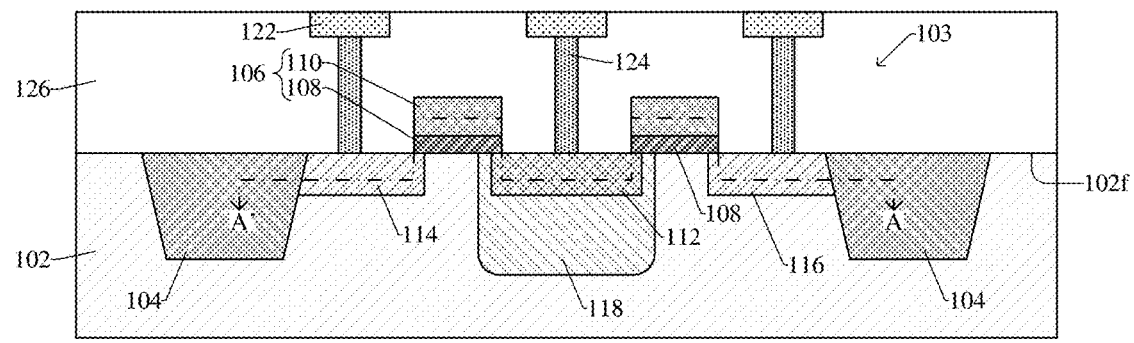
Figure 11B:
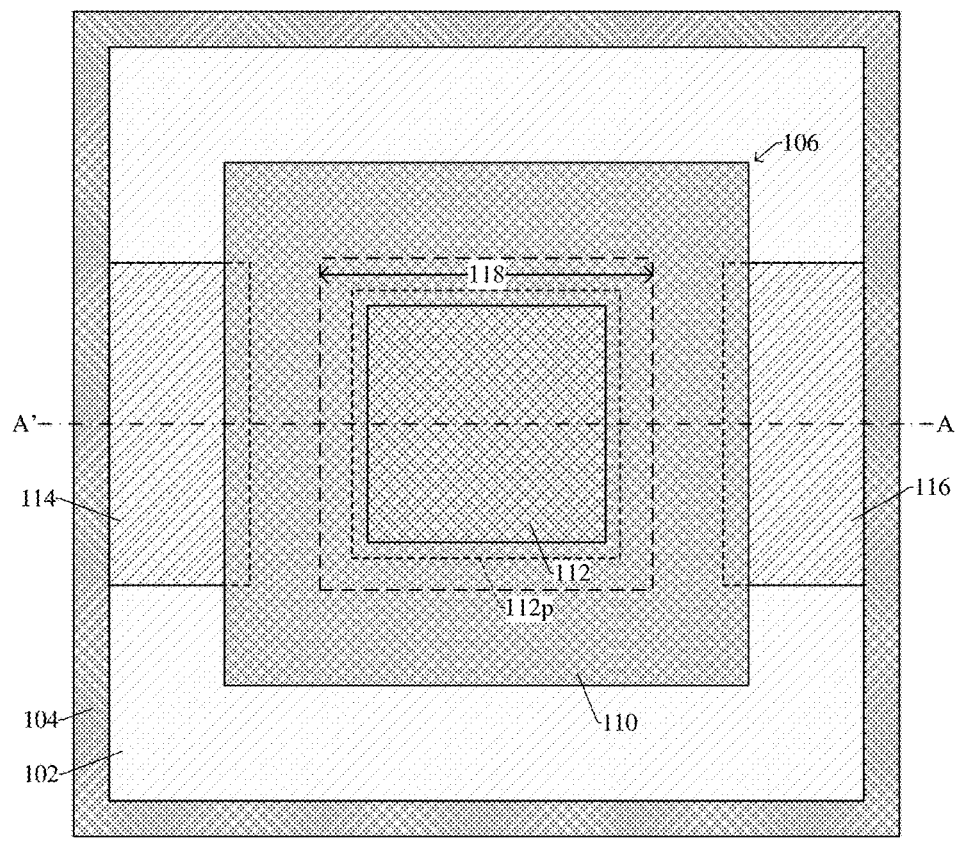

As shown in cross-sectional view 1100a and top view 1100b of FIGS. 11A-11b, an interconnect structure is formed over the semiconductor substrate 102. The interconnect structure includes a dielectric structure 126, a plurality of conductive wires 122, and a plurality of conductive vias 124. The dielectric structure 126 may be formed by a CVD process, a PVD process, an ALD process, or another suitable deposition or growth process. The plurality of conductive vias 124 and the plurality of conductive wires 122 may be formed by one or more patterning processes, one or more deposition processes, one or more planarization processes, and/or another suitable fabrication process.

Figure 12:
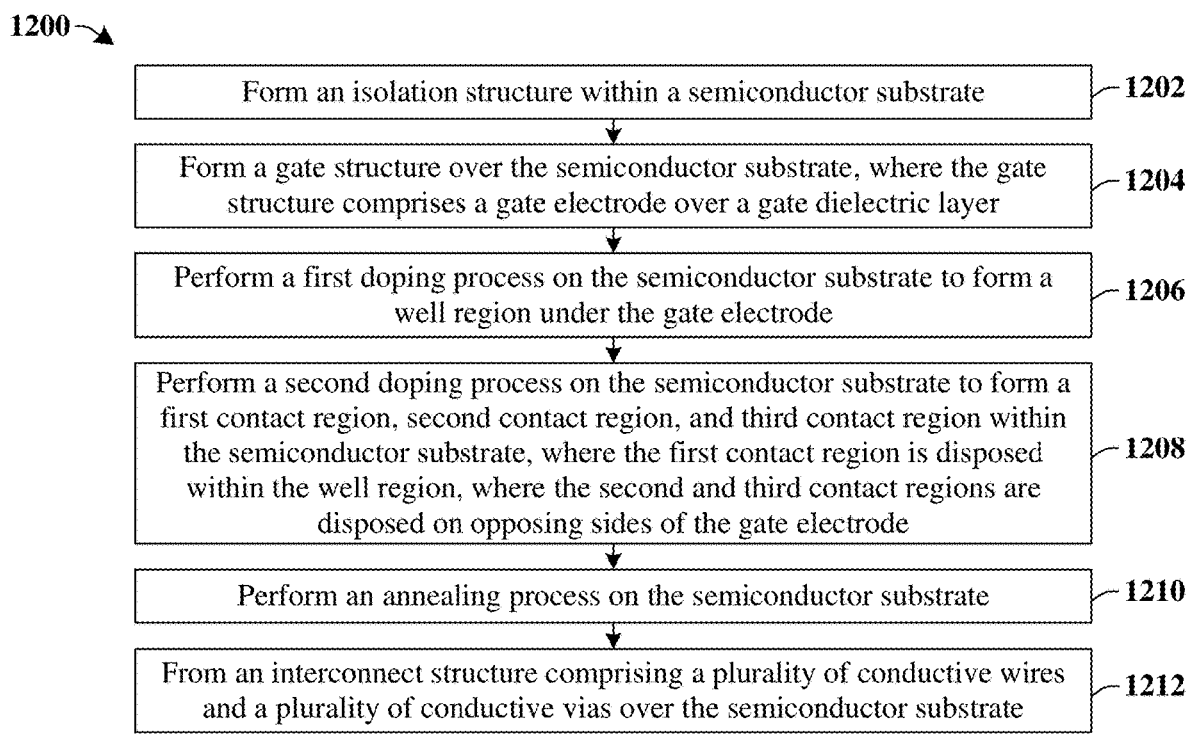
FIG. 12 illustrates a flowchart that illustrates some embodiments of a method for forming an integrated chip having a PN diode structure that comprises a gate electrode over a gate dielectric layer.

FIG. 12 illustrates a method 1200 for forming an integrated chip comprising a PN diode structure having a gate electrode over a gate dielectric layer according to the present disclosure. Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1202, an isolation structure is formed within a semiconductor substrate. FIGS. 6A-6B illustrate various views corresponding to some embodiments of act 1202.

At act 1204, a gate structure is formed over the semiconductor substrate, where the gate structure comprises a gate electrode over a gate dielectric layer. FIGS. 7A-7B illustrate various views corresponding to some embodiments of act 1204.

At act 1206, a first doping process is performed on the semiconductor substrate to form a well region under the gate electrode. FIGS. 8A-8B illustrate various views corresponding to some embodiments of act 1206.

At act 1208, a second doping process is performed on the semiconductor substrate to form a first contact region, a second contact region, and third contact region within the semiconductor substrate. The first contact region is disposed within the well region. The second and third contact regions are disposed on opposing sides of the gate electrode. FIGS. 9A-9B illustrate various views corresponding to some embodiments of act 1208.

At act 1210, an annealing process is performed on the semiconductor substrate. FIGS. 10A-10B illustrate various views corresponding to some embodiments of act 1210.

At act 1212, an interconnect structure is formed over the semiconductor substrate, where the interconnect structure comprises a plurality of conductive wires and a plurality of conductive vias. FIGS. 11A-11B illustrate various views corresponding to some embodiments of act 1212.

Accordingly, in some embodiments, the present application relates to a PN diode structure comprising a gate electrode overlying a gate dielectric layer, a first contact region, a second contact region, and a third contact region. The gate electrode laterally wraps around the first contact region, and the second and third contact regions are disposed on opposite sides of the gate electrode. The gate dielectric layer has a relatively large thickness (e.g., greater than about 140 Angstroms) configured to increase a distance between the gate electrode and the first contact region.

In some embodiments, the present application provides an integrated chip including: a well region disposed within a semiconductor substrate and comprising a first doping type; a gate electrode overlying the well region; a first contact region disposed within the well region and comprising a second doping type opposite the first doping type; a second contact region disposed within the semiconductor substrate and laterally offset from the well region, wherein the second contact region comprises the first doping type, wherein the gate electrode is disposed between the first contact region and the second contact region; and a gate dielectric layer disposed between the semiconductor substrate and the gate electrode, wherein a thickness of the gate dielectric layer is greater than about 140 Angstroms.

In some embodiments, the present application provides an integrated chip including: a well region disposed within a substrate and comprising a first doping type; a first contact region disposed within the well region and comprising a second doping type opposite the first doping type, wherein the well region abuts a perimeter of the first contact region at a PN junction; a ring-shaped gate structure disposed on the substrate, wherein the ring-shaped gate structure continuously laterally encloses the first contact region and directly overlies the PN junction; and a second contact region disposed within the substrate and laterally separated from the first contact region by the ring-shaped gate structure.

In some embodiments, the present application provides a method for forming an integrated chip, including: forming an isolation structure within a semiconductor substrate; forming a gate structure over the semiconductor substrate, wherein the gate structure comprises a gate electrode overlying a gate dielectric layer, wherein a thickness of the gate dielectric layer is about 140 Angstroms or greater; forming a well region within the semiconductor substrate, wherein the well region has a first doping type and is formed through an opening defined by sidewalls of the gate structure; forming a first contact region within the well region, wherein the first contact region is formed through the opening and comprises a second doping type opposite the first doping type; and forming a second contact region and a third contact region on opposite sides of the gate electrode, wherein the second and third contact regions respectively comprise the first doping type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, the method comprising:
    forming an isolation structure within a semiconductor substrate;
    forming a gate structure over the semiconductor substrate, wherein the gate structure comprises a gate electrode overlying a gate dielectric layer, wherein a thickness of the gate dielectric layer is about 140 Angstroms or greater;
    forming a well region within the semiconductor substrate, wherein the well region has a first doping type and is formed through an opening defined by sidewalls of the gate structure;
    forming a first contact region within the well region, wherein the first contact region is formed through the opening and comprises a second doping type opposite the first doping type; and
    forming a second contact region and a third contact region on opposite sides of the gate electrode, wherein the second and third contact regions respectively comprise the first doping type.

2. The method of claim 1, wherein the gate structure is disposed laterally between the first contact region and the second contact region, and wherein the gate structure is disposed laterally between the first contact region and the third contact region.

3. The method of claim 1, wherein the gate electrode and the gate dielectric layer are respectively ring-shaped and laterally enclose the first contact region.

4. The method of claim 1, further comprising:
    performing an annealing process on the semiconductor substrate, wherein the gate electrode directly overlies an outer region of the first contact region after the annealing process.

5. The method of claim 1, wherein a doping concentration of the first contact region is greater than a doping concentration of the well region.

6. The method of claim 1, wherein the gate structure, the first contact region, the second contact region, and the third contact region are part of a PN diode structure, wherein the first contact region is a cathode of the PN diode structure and the second and third contact regions are one or more anodes of the PN diode structure.

7. The method of claim 1, wherein the well region continuously laterally wraps around an outer perimeter of the first contact region, wherein the gate structure directly overlies the outer perimeter of the first contact region.

8. The method of claim 1, wherein the gate electrode is directly electrically coupled to the second contact region and the third contact region.

9. A method for forming an integrated chip, the method comprising:
    depositing a gate dielectric layer over a semiconductor substrate, wherein the semiconductor substrate comprises a first doping type;
    depositing a gate electrode over the gate dielectric layer;
    patterning the gate dielectric layer and the gate electrode to form a gate structure, wherein the gate structure comprises inner sidewalls defining an opening in the gate structure;
    performing a first doping process to form a well region in the semiconductor substrate, wherein the well region laterally extends between the inner sidewalls of the gate structure and is spaced between outer sidewalls of the gate structure;
    performing a second doping process to form a first contact region in the well region and between the inner sidewalls of the gate structure, wherein the first contact region comprises a second doping type opposite the first doping type; and
    performing a third doping process to form a second contact region in the semiconductor substrate adjacent to a first outer sidewall in the outer sidewalls of the gate structure, wherein the second contact region and the well region comprise the first doping type.

10. The method of claim 9, wherein the second doping process is different from the third doping process.

11. The method of claim 9, wherein outer sides of the first contact region are aligned with the inner sidewalls of the gate structure.

12. The method of claim 11, further comprising:
    performing an annealing process on the semiconductor substrate after the third doping process, wherein after the annealing process the outer sides of the first contact region extend past the inner sidewalls of the gate structure.

13. The method of claim 9, wherein the gate structure comprises a first gate segment continuously laterally extending from the second contact region to the first contact region, wherein a width of the first gate segment is less than a lateral distance between the inner sidewalls of the gate structure.

14. The method of claim 9, wherein a width of the well region is greater than a first distance between the inner sidewalls of the gate structure and is less than a second distance between the outer sidewalls of the gate structure.

15. The method of claim 9, further comprising:
forming an interconnect structure over the semiconductor substrate, wherein the interconnect structure comprises a plurality of conductive vias and conductive wires configured to directly electrically couple the gate electrode to the second contact region.

16. The method of claim 9, wherein the third doping process further forms a third contact region in the semiconductor substrate adjacent to a second outer sidewall in the outer sidewalls of the gate structure, wherein the third contact region comprises the first doping type, wherein a width of the first contact region is greater than a width of the third contact region.

17. A method for forming an integrated chip, the method comprising:
forming a gate structure on a semiconductor substrate, wherein the gate structure comprises a first gate segment laterally offset from a second gate segment;
forming a well region in the semiconductor substrate, wherein the well region comprises a first doping type and continuously laterally extends from under the first gate segment to under the second gate segment;
forming a first contact region in the well region and between the first and second gate segments, wherein the first contact region comprises a second doping type opposite the first doping type; and
forming a second contact region and a third contact region in the semiconductor substrate on opposing sides of the gate structure, wherein the first gate segment is spaced laterally between the first contact region and the second contact region, wherein the second gate segment is spaced laterally between the first contact region and the third contact region, wherein the second and third contact regions comprise the first doping type.

18. The method of claim 17, wherein the well region is laterally offset from the second contact region and the third contact region.

19. The method of claim 17, wherein the first and second gate segments are elongated in a first direction, wherein the gate structure comprises a third gate segment offset from a fourth gate segment, wherein the third and fourth gate segments are elongated in a second direction substantially orthogonal to the first direction, and wherein the third and fourth gate segments continuously laterally extend between the first and second gate segments.

20. The method of claim 19, wherein a lateral distance between the first and second gate segments is greater than widths of the first gate segment, the second gate segment, the third gate segment, and the fourth gate segment.

* * * * *